(12) United States Patent
Ikuhashi

(10) Patent No.: US 6,614,105 B2
(45) Date of Patent: Sep. 2, 2003

(54) CHIP-TYPE SEMICONDUCTOR DEVICE

(75) Inventor: Ryoichi Ikuhashi, Osaka (JP)

(73) Assignees: Powered Co., Ltd., Osaka (JP); Omron Corporation, Kyoto-fu (JP)

(*) Notice: Subject to any disclaimer, the term of this patent is extended or adjusted under 35 U.S.C. 154(b) by 0 days.

(21) Appl. No.: 09/794,629

(22) Filed: Feb. 28, 2001

(65) Prior Publication Data

US 2001/0017377 A1 Aug. 30, 2001

(30) Foreign Application Priority Data

Feb. 29, 2000  (JP) .......................... 2000-052699

(51) Int. Cl.⁷ .............................................. H01L 23/48
(52) U.S. Cl. ...................... 257/688; 257/181; 257/747; 257/765; 257/771
(58) Field of Search ................. 257/678, 737, 257/741, 753, 762, 765, 783, 786, 747, 771, 781, 181, 688, 785; 438/612, 613, 614, 615, 688

(56) References Cited

U.S. PATENT DOCUMENTS 5,081,067 A * 1/1992 Shimizu et al. ............. 257/698
6,033,787 A * 3/2000 Nagase et al. .............. 428/545

FOREIGN PATENT DOCUMENTS

JP  53-117966  * 10/1978
JP  9-27572    * 11/1988

* cited by examiner

*Primary Examiner*—Phat X. Cao
*Assistant Examiner*—Theresa T. Doan
(74) *Attorney, Agent, or Firm*—Foley & Lardner

(57) ABSTRACT

A TRIAC which is one species of chip-type semiconductors includes an element body made of silicon, electrodes provided on one face of the element body, a molybdenum plate provided on one of the electrodes by an alloy plate made of aluminum and silicon, a molybdenum plate provided on the other face of the element body by a similar alloy plate, and nickel layers provided on connection faces of the molybdenum plates to outer electrode plates, so that the electrode and molybdenum plate are firmly connected without conventional high-temperature solder which includes a great amount of lead, and that the alloy plate never melt even when newly developed low-temperature institute is employed, and that the operation of the molybdenum plates is sufficiently realized.

17 Claims, 4 Drawing Sheets

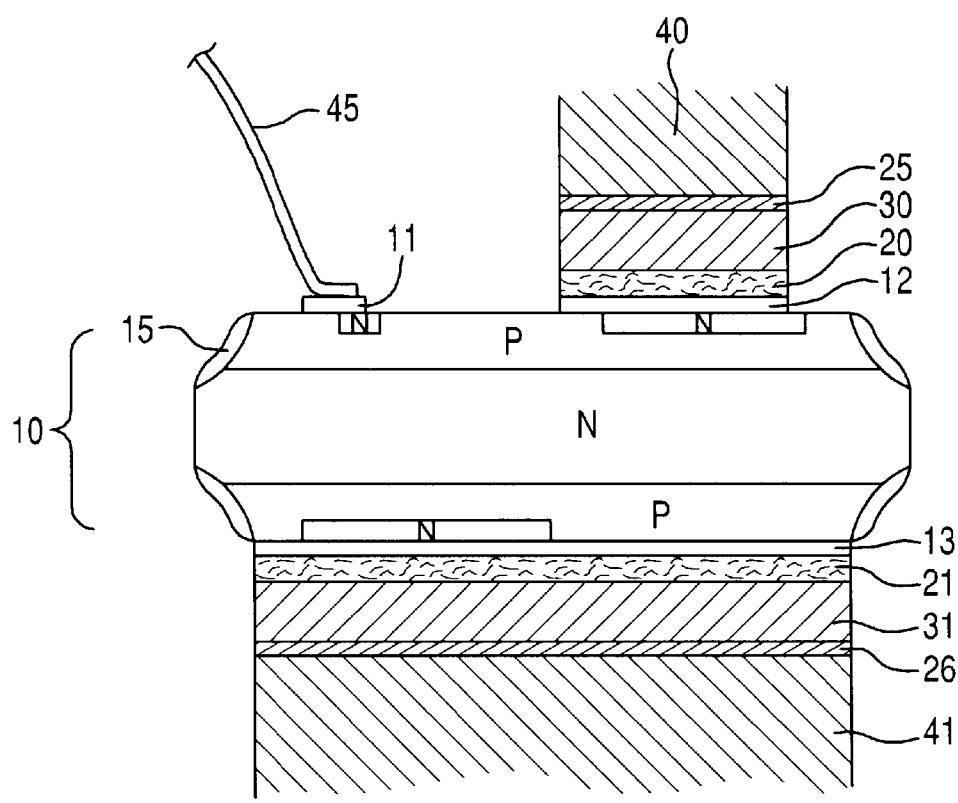

CHIP-TYPE SEMICONDUCTOR DEVICE

TECHNICAL FIELD OF THE INVENTION

The present invention relates to a chip-type semiconductor device. More particularly, the present invention relates to a chip-type semiconductor device having an element body, an electrode provided on at least one surface of the element body, and a thermal stress cushioning plate provided on the electrode by interposing an alloy plate made of aluminum and silicon.

DESCRIPTION OF THE RELATED ART

FIG. 7 illustrates an arrangement of a TRIAC which is a typical example of such chip-type semiconductor device. This TRIAC has electrodes 11 and 12 on one surface (upper surface in FIG. 7) of an element body 10 made of silicon and an electrode 13 on the other surface (lower surface in FIG. 7). On the electrode 12, a molybdenum plate 30 is provided as a thermal stress cushioning plate by a high-temperature (melting point of about 290° C.) solder layer 20. And, on the electrode 13, a molybdenum plate 31 is provided as a thermal stress cushioning plate by a hightemperature solder layer 21.

When a user mounts the TRIAC on a circuitry substrate or the like, the molybdenum plate 30 is secured to an outer electrode plate (T1 terminal) 40 made of copper by a low-temperature (melting point of about solder 180° C.) layer 25, and the molybdenum plate 31 is secured to an outer electrode plate (T2 terminal) 41 made of copper by a low-temperature layer 26, and a wire (gate lead) 45 made of aluminum is bonded to the electrode 11.

Wherein, the molybdenum plates 30 and 31 are employed for preventing application of thermal stress to the element body 10, the thermal stress being caused by difference between thermal expansion coefficient of the outer electrode plates 40 and 41 and thermal expansion coefficient of the element body 10 made of silicon.

For the above chip-type semiconductor device, a providing and securing method which does not include lead is required to be developed, because lead (Pb) included within the high-temperature solder layer 20 and 21 and within the low-temperature solder layer 25 and 26 is harmful following a home electric device recycle law which will be issued soon and an European parliamentary instruction regarding waste electronic devices.

The low-temperature solder is used for connecting the chip-type semiconductor device to the outer electrode plates 40 and 41. The composition of the low-temperature is Pb: 38% and Sn: 62%, for example. For the low-temperature solder, new low-temperature solder is going to be produced commercially instead the above low-temperature solder, but the melting point of the new low-temperature solder is increased, i.e. 240~250° C.

On the other hand, the high-temperature solder is used for adhering silicon (element body 10) and molybdenum (molybdenum plates 30 and 31). The composition of the high-temperature solder is Pb: 92.5%, Ag: 2.5%, and In: 5%, for example. The Pb content is remarkably great for increasing the adhesion force of the both by increasing viscosity. It is a great issue how to deal or improve or the like the high-temperature solder, especially. But, no effective measure is taken at all under the present condition.

Further, when the melting point of the low-temperature solder used by a user is not sufficiently lower than that of the high-temperature solder which is used for the chip-type semiconductor, the high-temperature solder layers 20 and 21 of the chip-type semiconductor device are melted easily by the heat generated by soldering when the chip-type semiconductor device is connected to the outer electrode plates 40 and 41. The substitute of the above low-temperature solder is high in melting point such as 240~250° C. Therefore, when such substitute is employed, adhesive agent having higher melting point should be employed instead the conventional adhesive agent for adhering the element body 10 and the molybdenum plates 30 and 31. It is difficult for developing such adhesive agent having a high melting point.

Furthermore, the molybdenum plates 30 and 31 cannot sufficiently realize thermal stress cushioning effect which is the essential characteristic, because the molybdenum plates 30 and 31 and the element body 10 are adhered by the high-temperature solder layers 20 and 21. Therefore, the expansion quantity of solder is directly applied to the element body 10 in real so that the thermal stress life of the element body 10 is directly influenced badly.

The present invention was made in view of the conventional problems.

It is an object of the present invention to offer a chip-type semiconductor device which employs means for firmly connecting an electrode and a thermal stress cushioning plate without employing conventional high-temperature solder having extremely great Pb content, and for preventing melting even when new developed low-temperature solder substitute is employed, and for sufficiently make the most of the operation of a thermal stress cushioning plate.

A chip-type semiconductor device according to the present invention comprises an element body, an electrode provided on at least one surface of the element body, a thermal stress cushioning plate, and an alloy plate made of aluminum and silicon for connecting the electrode and the thermal stress cushioning plate.

In one embodiment of the present invention, a composition of the alloy plate is aluminum content of 87~89% and silicon content of 11~13%. Within this extent, it is most preferable in operations and effects that the alloy plate has the composition for aluminum content of 88% and silicon content of 12% so that the eutectic temperature becomes extremely high temperature of about 580° C.

BRIEF DESCRIPTION OF THE DRAWINGS

FIG. 7 is a cross sectional view of a conventional TRIAC.

DETAILED DESCRIPTION OF THE EMBODIMENTS

Hereinafter, referring to the attached drawings, we explain the present invention in detail.

Figure 1:
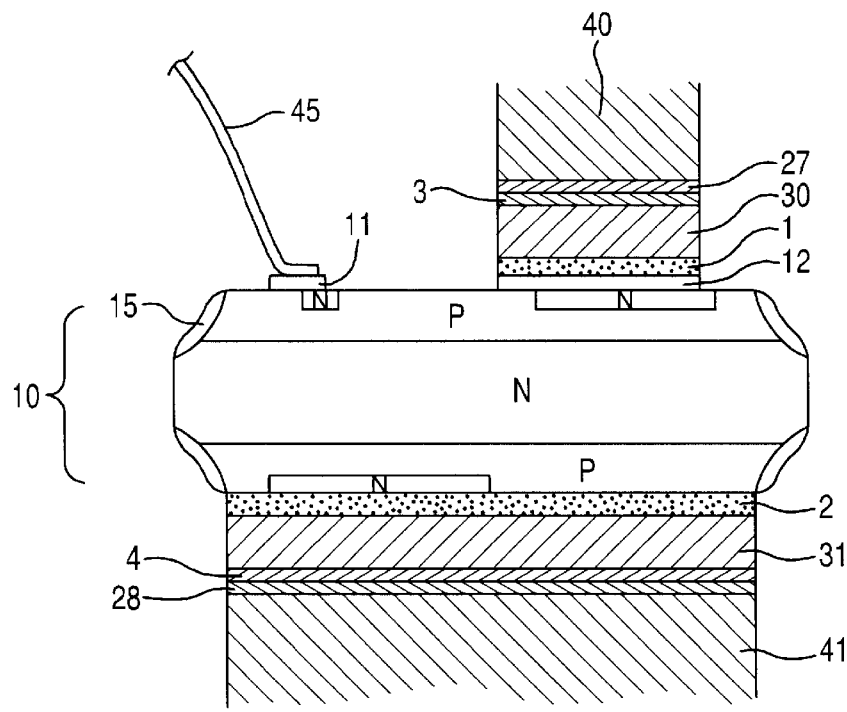
FIG. 1 is a cross sectional view illustrating an arrangement of a TRIAC which is an embodiment of a chip-type semiconductor device.

FIG. 1 illustrates an arrangement of a TRIAC which is an embodiment of a chip-type semiconductor device.

This TRIAC has an arrangement which is the same to that of the TRIAC illustrated in FIG. 7 excepting that alloy plates 1 and 2, and nickel layers 3 and 4 are provided and that the electrode 13 is not necessary. That is, this TRIAC includes an element body 10 made of silicon, and electrodes 11 and 12 made of aluminum on one surface (upper surface in FIG. 1) of the element body 10. A molybdenum plate 30 as a thermal stress cushioning plate is provided to the electrode 12 by an alloy plate 1 made of aluminum and silicon, for example. A molybdenum plate 31 is provided to the other surface (lower surface in FIG. 1) of the element body 10 by an alloy plate 2 which is similar to the alloy plate 1. Further, nickel layers 3 and 4 are provided on connection face of the molybdenum plates 30 and 31 to the outer electrode plates 40 and 41.

The element body 10 is constituted with a plurality of N-layer and P-layer, and corner sections of the element body 10 are covered by glass 15. The electrodes 11 and 1 2 are made by deposition of aluminum. The nickel layers 3 and 4 are used for making soldering easily when a user employs low-temperature solder. The nickel layers 3 and 4 may be nickel clad (made by sticking a nickel plate and a molybdenum plate) or may be formed by nickel plating.

When a user mounts this TRIAC to a circuitry substrate or the like, the molybdenum plate 30 is connected to the outer electrode plate (T1 terminal) 40 made of copper by solder 27, and the molybdenum plate 31 is connected to the outer electrode plate (T2 terminal) 41 made of copper by solder 28, and a wire (gate lead) 45 made of aluminum is bonded to the electrode 11. The solder 27 and 28 may be conventional low-temperature solder or may be the above low-temperature solder substitute. The low-temperature solder substitute has a high melting point of 240~250° C., but the eutectic temperature of the alloy plates 1 and 2 is about 580° C. and is greatly higher than the melting point, therefore no problems arise and generality is improved.

In this TRIAC, the molybdenum plates 30 and 31 are provided by alloy plates 1 and 2 made of aluminum and silicon, so that not only silicon constituting the element body 10 and the alloy plates 1 and 2 but also the alloy plates 1 and 2 and the molybdenum plates 30 and 31 can be simultaneously and firmly connected, and thermal contraction (temperature cycle) characteristic is greatly improved. Moreover, when the alloy plates 1 and 2 are employed, a eutectic alloy layer is formed in the element body 10 by aluminum which is one component of the alloy plates 1 and 2, so that ohmic characteristic of the element body 10 is improved. Of course, the TRIAC is in conformity with the home electric device recycle law and the like, because the alloy plates 1 and 2 do not include noxious element such as lead and the like. Further, the thermal stress cushioning operation of the molybdenum plates 30 and 31 is sufficiently realized so as to lengthen the thermal stress life of the element body 10.

When the molybdenum plates 30 and 31 are connected to the element body 10 by the alloy plates 1 and 2, the element body 10, the alloy plates 1 and 2, and the molybdenum plates 30 and 31 are put within a hydrogen reducing furnace under the condition that the alloy plates 1 and 2 are put between the element body 10 and the molybdenum plates 30 and 31, heat processing with temperature of 680° C. is carried out for about 15 minutes, so that the molybdenum plates 30 and 31 are provided to the element body 10 by interposing the alloy plates 1 and 2. The usage of the hydrogen reducing furnace is for preventing oxidation of the alloy plates 1 and 2 and the like.

When metal such as aluminum (Al) or silver (Ag) is previously evaporated by 0.5~10 μm by vacuum evaporation to the molybdenum plates 30 and 31, heat processing can be performed with temperature lower than 680° C., and adherence to the alloy (Al/Si) plate is improved. In this case, ambient atmosphere of the heat processing is not limited to hydrogen ambient atmosphere. Alloying processing (heat processing) can be performed within $N_2$ (Nitrogen) ambient atmosphere.

Figure 2:
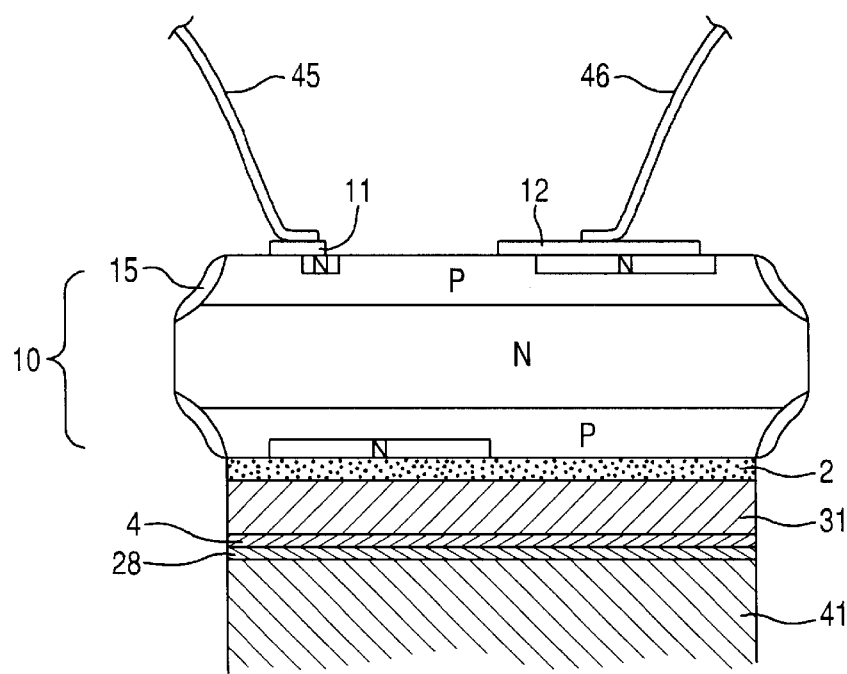
FIG. 2 is a cross sectional view illustrating an arrangement of a TRIAC which is another embodiment of a chip-type semiconductor device.

FIG. 2 illustrates an arrangement of a TRIAC which is a chip-type semiconductor device of another embodiment.

In this TRIAC, no molybdenum plate is provided on the electrode 12, and a wire (T1 lead) 46 made of aluminum is bonded to the electrode 12. The other arrangements are the same as those of the TRIAC illustrated in FIG. 1.

Figure 3:
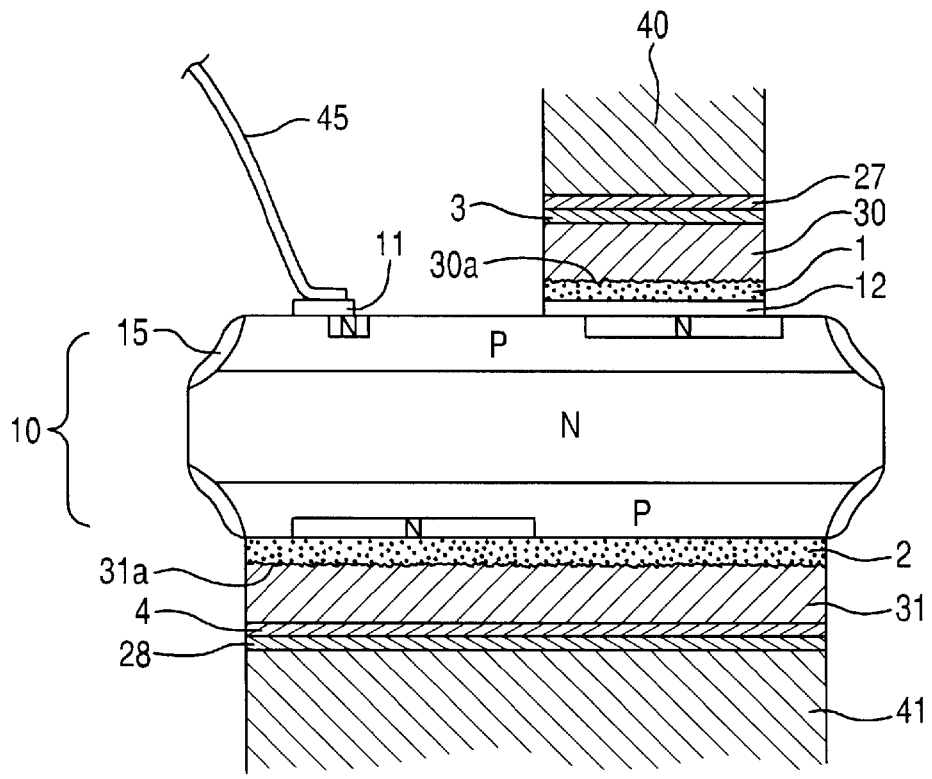
FIG. 3 is a cross sectional view illustrating an arrangement of a TRIAC which is a further embodiment of a chip-type semiconductor device.

FIG. 3 illustrates an arrangement of a TRIAC which is a chip-type semiconductor device of a further embodiment.

This TRIAC has an arrangement which is the same to the arrangement of the TRIAC illustrated in FIG. 1, fundamentally. This TRIAC is different from the TRIAC illustrated in FIG. 1 in that connection faces of the molybdenum plates 30 and 31 to the alloy plates 1 and 2 are formed to be rough surfaces 30a and 31a. When the rough surfaces 30a and 31a are formed, contacting area to the alloy plates 1 and 2 substantially increase so as to improve connection strength of the molybdenum plates 30 and 31 and the alloy plates 1 and 2. Specific example of the rough surfaces 30a and 31a is exemplified as wave shaped face, saw-tooth shaped face, rectangular tooth shaped face, irregular unevenness face and the like. But, the shape of the rough surfaces 30a and 31a is not limited to the above shapes as long as the connection area of the molybdenum plates 30 and 31 and the alloy plates 1 and 2 is increased.

Figure 4:
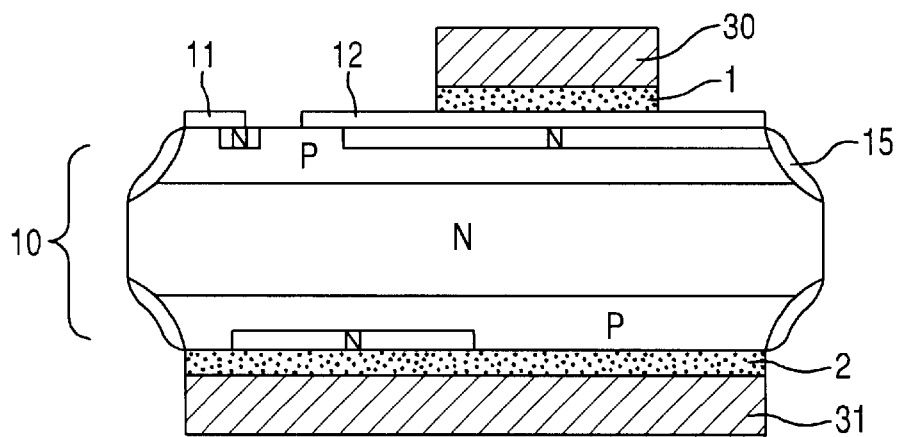
FIG. 4 is a cross sectional view illustrating an arrangement of a TRIAC which is a further embodiment of a chip-type semiconductor device.
Figure 6:
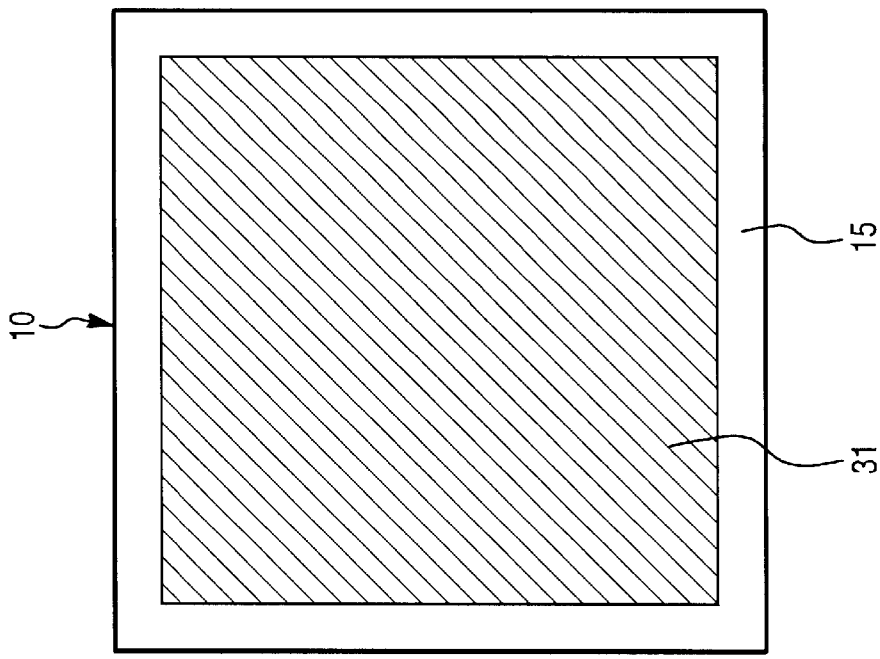
FIG. 6 is a bottom view of the TRIAC illustrated in FIG. 4.
Figure 5:
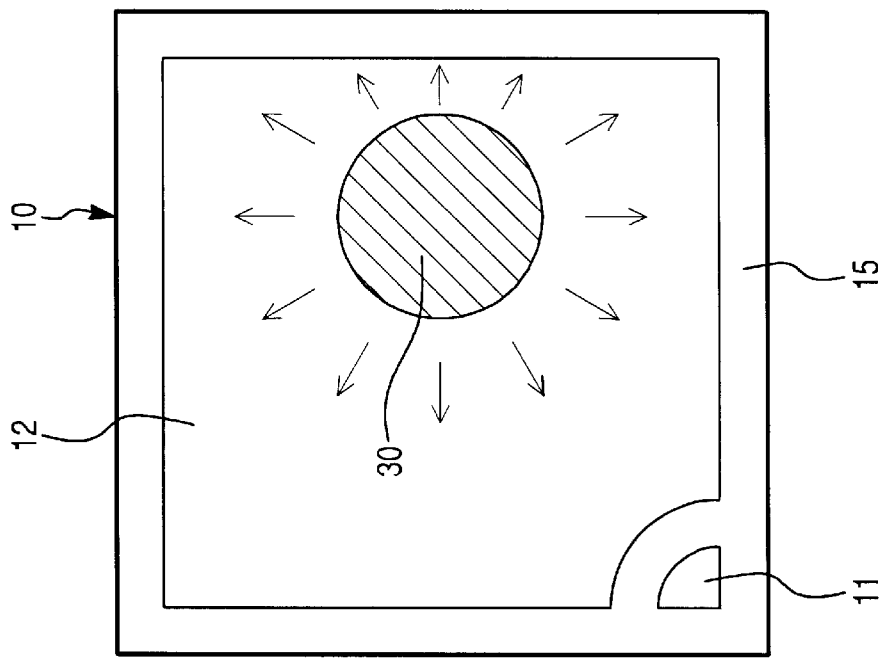
FIG. 5 is a plan view of the TRIAC illustrated in FIG. 4.

The TRIAC of each of the above embodiments is merely an example. A TRIAC can be applied the optimum designing corresponding to a usage so as to realize high reliance and high function. For example, the size of the thermal stress cushioning plate can be applied the optimum designing in accordance with the shape of the user-side outer electrode plate and the heat capacity. That is, the thermal stress cushioning plate is enlarged when the outer electrode plate is great, while the thermal stress cushioning plate is made to have a small size when the outer electrode plate is small. Especially, when the thermal stress cushioning plate is made to have a small size in accordance with the small outer electrode plate, the T1 electrode 12 of the element body 10 is increased its area, as is illustrated in FIG. 4 (arrangement figure), in FIG. 5 (plan view thereof), and in FIG. 6 (bottom view thereof), so that the current from the small thermal stress cushioning plate (molybdenum plate 30) expands in all directions as is illustrated by arrows in FIG. 5. The T1 electrode 12 is formed by aluminum deposition layer (thickness: ~10 μm).

In the above embodiments, a TRIAC is employed as an example of a chip-type semiconductor device. When the above other semiconductor devices are manufactured similarly, operations and effects are realized which are similar to those of the above embodiments.

As is described above, following effects are realized when the chip-type semiconductor device according to the present invention is employed.

(1) The chip-type semiconductor device is conformity with the home electric device recycle law and the like, because the alloy plates are made of aluminum and silicon and includes no harmful lead.

(2) Not only silicon constituting the semiconductor device and the thermal stress cushioning plates but also the alloy plates and the thermal stress cushioning plates are simultaneously and firmly connected, because the composition of the alloy plates is aluminum and silicon.

(3) No problems arise even when low-temperature solder substitute is employed for connecting the semiconductor device to the outer y higher than the melting point of 240~250° C. of the low-temperature solder institute.

(4) The thermal stress cushioning operation of the thermal stress cushioning plate is sufficiently realized so as to lengthen the thermal stress life of the chip-type semiconductor device, because the thermal stress cushioning plate and the element body are connected to one another without high-temperature solder.

(5) Ohmic characteristic is improved, because the eutectic alloy layer is formed by aluminum which is one component of the alloy plate and by silicon which is one component of the element body.

(6) Thermal contraction (temperature cycle) characteristic is greatly improved, because the connection strength of the element body and the thermal stress cushioning plate is improved.

(7) Optimum designing in accordance with usage is possible, and high reliance and high function are realized, because the semiconductor device is a chip-type one.

(8) When the connection face of the thermal stress cushioning plate to the alloy plate is formed to be a rough surface, connection strength of the thermal stress cushioning plate and the alloy plate is improved more.

(9) When the nickel layer is provided on the connection face of the thermal stress cushioning plate to the outer electrode, and when a user uses low-temperature solder, soldering operation becomes easier.

It can be seen that in one aspect of the invention, the alloy plate employed in the chip-type semiconductor device is made of aluminum and silicon, and includes no harmful lead, so that the chip-type semiconductor is in sufficient conformity with the home electric device recycle law and the like. Further, the alloy plate is made of aluminum and silicon, so that not only the silicon semiconductor device and the alloy plate but also the alloy plate and the thermal stress cushioning plate (having a thermal expansion coefficient which is similar to that of silicon) made of molybdenum, tungsten, covar and the like are simultaneously and firmly connected. Furthermore, a eutectic temperature of the alloy plate may vary to some degree depending upon components content but is significantly lower than the melting point of 240~250° C. of the above low-temperature solder substitute. Thus, no problems arise when the solder substitute is used for connecting the semiconductor device and the outer electrode plate.

It can be seen in a further aspect of the present invention, the thermal stress cushioning operation of the thermal stress cushioning plate is sufficiently realized so as to lengthen thermal stress life of the element body, because the thermal stress cushioning plate and the element body are connected without the high-temperature solder.

It is noted that when a plate made of only aluminum is employed instead of the alloy plate, adhesion strength with the thermal stress cushioning plate becomes weaker.

For the present invention, the chip-type semiconductor device includes all power semiconductors or the like including diodes, transistors, thyristers, TRIAC's, IGBT's and the like. Material of the thermal stress cushioning plate is exemplified as molybdenum, tungsten, covar and the like.

The foregoing description of a preferred embodiment of the invention has been presented for purposes of illustration and description, It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined in the claims appended hereto, and their equivalents.

What is claimed is:

1. A chip-type semiconductor device comprising;
   an element body;
   an electrode which is provided on at least one surface of the element body;
   a thermal stress cushioning plate; and
   an alloy plate made of aluminum and silicon for connecting the thermal stress cushioning plate to the electrode, a composition rate of aluminum being in the range of 87% to 89% and a composition rate of silicon being in the range of 11% to 13%,
   wherein no solder layer is disposed between the electrode and the alloy plate and no solder layer is disposed between the alloy plate and the thermal stress cushioning plate,
   wherein the thermal stress cushioning plate has a rough surface on a connection side to the alloy plate, and
   wherein connection of the thermal stress cushioning plate and the electrode by the alloy plate is carried out within a reducing furnace.

2. A chip-type semiconductor device as set forth in claim 1, wherein the thermal stress cushioning plate has a nickel layer on its connection face to an outer electrode.

3. A chip-type semiconductor device comprising;
   an element body;
   an electrode which is provided on at least one surface of the element body;
   a thermal stress cushioning plate; and
   an alloy plate made of aluminum and silicon for connecting the thermal stress cushioning plate to the electrode,
   wherein no solder layer is disposed between the electrode and the alloy plate and no solder layer is disposed between the alloy plate and the thermal stress cushioning plate, and
   wherein the alloy plate is not substantially oxidized when the thermal stress cushioning plate is connected to the electrode by the alloy plate.

4. A chip-type semiconductor device as set forth in claim 3, wherein the alloy plate has the component content of aluminum: 87~89% and silicon: 11~13%.

5. A chip-type semiconductor device as set forth in claim 3, wherein the thermal stress cushioning plate has a rough surface on its connection side to the alloy plate.

6. A chip-type semiconductor device as set forth in claim 3, wherein the thermal stress cushioning plate has a nickel layer on its connection face to an outer electrode.

7. A chip-type semiconductor device as set forth in claim 3, wherein connection of the thermal stress cushioning plate to the electrode by the alloy plate is carried out within a hydrogen reducing furnace.

8. A chip-type semiconductor device as set forth in claim 7, wherein connection of the thermal stress cushioning plate to the electrode by the alloy plate is carried out for about 15 minutes within the hydrogen reducing furnace.

9. A chip-type semiconductor device as set forth in claim 3, wherein connection of the thermal stress cushioning plate to the electrode by the alloy plate is carried out at a temperature not greater than about 680° C.

10. chip-type semiconductor device as set forth in claim 9, wherein connection of the thermal stress cushioning plate to the electrode by the alloy plate is carried out at a temperature of about 680° C.

11. A chip-type semiconductor device comprising;

an element body;

an electrode which is provided on at least one surface of the element body;

a thermal stress cushioning plate; and an alloy plate made of aluminum and silicon for connecting the thermal stress cushioning plate to the electrode, wherein no solder layer is disposed between the electrode and the alloy plate and no solder layer is disposed between the alloy plate and the thermal stress cushioning plate, and wherein the thermal stress cushioning plate has a rough surface on its connection side to the alloy plate and wherein the alloy plate is not substantially oxidized when the thermal stress cushioning plate is connected to the electrode by the alloy plate.

12. A chip-type semiconductor device as set forth in claim 11, wherein the alloy has the component content of aluminum: 87~89% and silicon: 11~13%.

13. A chip-type semiconductor device as set forth in claim 11, wherein the thermal stress cushioning plate has a nickel layer on its connection face to an outer electrode.

14. A chip-type semiconductor device as set forth in claim 11, wherein connection of the thermal stress cushioning plate to the electrode by the alloy plate is carried out within a hydrogen reducing furnace.

15. A chip-type semiconductor device as set forth in claim 14, wherein connection of the thermal stress cushioning plate to the electrode by the alloy plate is carried out for about 15 minutes within the hydrogen reducing furnace.

16. A chip-type semiconductor device as set forth in claim 11, wherein connection of the thermal stress cushioning plate to the electrode by the alloy plate is carried out at a temperature not greater than about 680° C.

17. chip-type semiconductor device as set forth in claim 16, wherein connection of the thermal stress cushioning plate to the electrode by the alloy plate is carried out at a temperature of about 680° C.

* * * * *